(12) United States Patent
Dormans et al.

(10) Patent No.: US 6,326,661 B1
(45) Date of Patent: Dec. 4, 2001

(54) SEMICONDUCTOR DEVICE

(75) Inventors: Guido J. M. Dormans; Robertus D. J. Verhaar, both of Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/616,630

(22) Filed: Jul. 26, 2000

(30) Foreign Application Priority Data

Jul. 29, 1999 (EP) .................................................. 99202477

(51) Int. Cl.$^7$ .................................................. H01L 29/788
(52) U.S. Cl. .......................... 257/315; 257/314; 257/390; 365/185; 365/185.03; 365/185.14
(58) Field of Search .................................. 257/314, 315, 257/316, 317, 390, 391; 365/185, 185.03, 185.14

(56) References Cited

U.S. PATENT DOCUMENTS

| | | | |
|---|---|---|---|
| 5,280,446 | * 1/1994 | Ma et al. .............................. | 365/185 |
| 5,445,983 | * 8/1995 | Hong ...................................... | 437/43 |
| 5,614,429 | * 3/1997 | Shin et al. ............................. | 437/43 |
| 5,666,307 | * 9/1997 | Chang ................................ | 365/185.03 |
| 5,912,843 | * 6/1999 | Jeng ................................. | 365/185.14 |

FOREIGN PATENT DOCUMENTS

0763856-A1 * 3/1997 (EP) .
0763856A1    3/1997 (EP) .
02000277636-A * 10/2000 (JP) .

* cited by examiner

Primary Examiner—Nathan Flynn
Assistant Examiner—Remmon R. Fordé
(74) Attorney, Agent, or Firm—Aaron Waxler

(57) ABSTRACT

A semiconductor device comprises a semiconductor body (1) having a region (2) of a first conductivity type adjoining a surface (3) of the semiconductor body (1), which semiconductor body (1) is provided at the surface (3) with a non-volatile memory cell. The memory cell comprises a source (4) and a drain (5) of an opposite, second conductivity type provided in the semiconductor body (1), between which source (4) and drain (5) the surface (3) of the semiconductor body (1) is provided with a floating gate (6) and a select gate (10). The floating gate (6) and the select gate (10) both have a substantially flat surface portion (13) extending substantially parallel to the surface (3) of the semiconductor body (1) and side-wall portions (14) extending substantially transversely to the surface (3) of the semiconductor body (1). A control gate (7) is situated above the floating gate (6), and is capacitively coupled to the substantially flat surface portion (13) of the floating gate (6) and to at least the side-wall portions (14) of the floating gate (6) facing the source (4) and the drain (5). Moreover, the control gate (7) overlaps the select gate (10) and ends above the substantially flat surface portion (13) of the select gate (10).

8 Claims, 2 Drawing Sheets

SEMICONDUCTOR DEVICE

BACKGROUND OF THE INVENTION

The invention relates to a semiconductor device comprising a semiconductor body having a region of a first conductivity type adjoining a surface of the semiconductor body, which semiconductor body is provided at the surface with a non-volatile memory cell comprising a source and a drain of an opposite, second conductivity type provided in the semiconductor body, between which source and drain the surface of the semiconductor body is provided with a floating gate and a select gate, the floating gate and the select gate both having a substantially flat surface portion extending substantially parallel to the surface of the semiconductor body and having side-wall portions extending substantially transversely to the surface of the semiconductor body, above which floating gate a control gate is situated, which control gate overlaps the select gate.

Such a non-volatile memory cell, which is often referred to as an EEPROM (Electrically Erasable Programmable Read-Only Memory) cell, comprises at least one select transistor and a field-effect transistor with floating gate, also referred to as floating gate transistor.

A semiconductor device of the kind mentioned in the opening paragraph is known from EP-A-763 856. In the known semiconductor device the control gate stretches out over the select gate to substantially beyond the side-wall portion of the select gate facing away from the floating gate.

A disadvantage of the known semiconductor device is that the size of the memory cell is large owing to the fact that the control gate extends out to substantially beyond the sidewall portion of the select gate facing away from the floating gate. As a consequence, the density of memory cells in a non-volatile memory of a given size is small. In addition, parasitic capacitances are induced between the control gate and the select gate as a result of the closeness between the control gate and the select gate during operation of the memory cell, which parasitic capacitances adversely increase the RC time of the select gate. Moreover, it is not possible to subject the select gate of the memory cell to a self-aligned silicide process, also referred to as salicide process, to reduce its sheet and contact resistance. Hence, the resistance of the select gate is large, which also adversely influences the RC time of the select gate.

SUMMARY OF THE INVENTION

The invention has inter alia for its object to provide a semiconductor device of the kind mentioned in the opening paragraph, which semiconductor device provides a large capacitive coupling between the control gate and the floating gate of the memory cell while counteracting the above-mentioned disadvantages.

According to the invention, this object is achieved in that the control gate is capacitively coupled to the substantially flat surface portion of the floating gate and to at least the side-wall portions of the floating gate facing the source and the drain, and ends above the substantially flat surface portion of the select gate. These measures provide a semiconductor device having a large capacitive coupling between the control gate and the floating gate of the memory cell and counteracting the above-mentioned disadvantages. Since the control gate ends above the substantially flat surface portion of the select gate, the size of the memory cell is smaller. As a consequence, the density of memory cells in a non-volatile memory of a given size is larger. Moreover, the parasitic capacitances between the control gate and the select gate are smaller, which decreases the RC time of the select gate. As the select gate is not entirely covered with the control gate, the select gate can be partially subjected to the earlier-mentioned self-aligned silicide process in order to reduce its resistance and, hence, its RC time.

A preferred embodiment of the semiconductor device in accordance with the invention is characterized in that a substantial part of the substantially flat surface portion of the select gate is left free. As a consequence, the parasitic capacitances between the control gate and the select gate are reduced, and a larger area of the select gate can be subjected to the above-mentioned self-aligned silicide process, which reduces the resistance of the select gate. Both effects further decrease the RC time of the select gate.

If the memory cell comprises one select gate, which memory cell is also referred to as two-transistor (2T) cell, the select gate is advantageously provided at the side of the floating gate adjacent to the source. Since a select transistor needs to switch through a lower programming voltage when provided at the side of the source than when provided at the side of the drain, it can be processed with a thinner gate oxide, for example the same gate oxide as applied for adjacent floating gate transistors, which enables the use of a smaller channel length to avoid punch-through.

Although the invention is applicable to a stand-alone non-volatile memory, special advantages are obtained for a non-volatile memory embedded in a CMOS or BICMOS integrated circuit, as smaller memory cells can be manufactured without an increase in the CMOS or BICMOS process complexity.

Further advantageous embodiments of the semiconductor device in accordance with the invention are described in other dependent claims.

BRIEF DESCRIPTION OF THE DRAWINGS

These and other aspects of the invention will be apparent from and be elucidated with reference to the embodiments described hereinafter and shown in the drawing. In the drawing.

DESCRIPTION OF THE PREFERRED EMBODIMENTS

Figure 1:
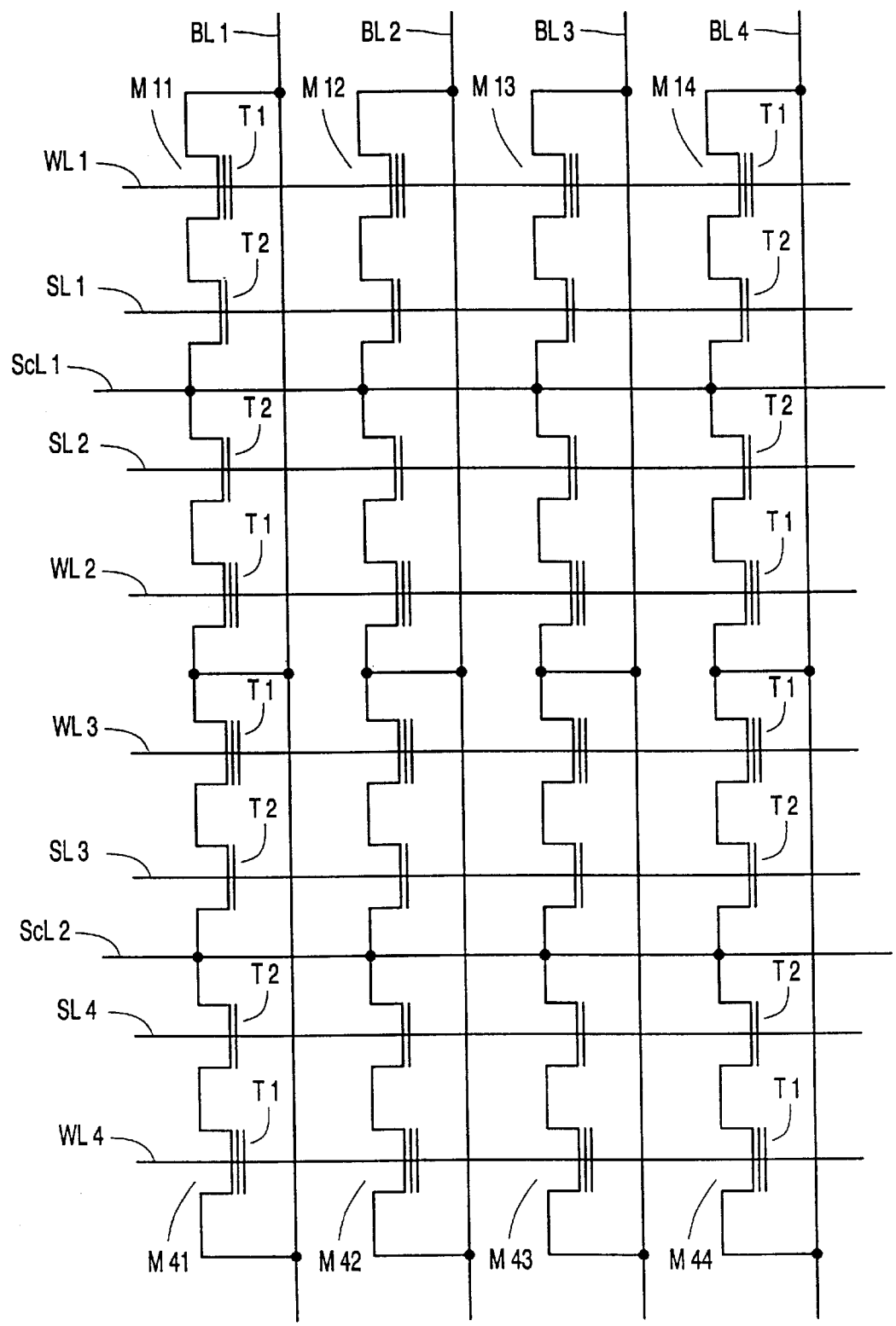
FIG. 1 shows an electric circuit diagram of a non-volatile memory in accordance with the invention.

FIG. 1 shows an electric circuit diagram of a non-volatile memory in accordance with the invention, which non-volatile memory comprises a matrix of memory cells, which are arranged in m rows and n columns. Although the number of rows and the number of columns equal 4 in the present example, it will be evident that the number of rows and the number of columns in general are much larger. The memory cells in a row are indicated by $Mi1, Mi2, \ldots, Min$ with i representing the number of the row. The memory cells in a column are indicated by $M1j, M2j, \ldots, Mmj$ with j representing the number of the column. The memory cells share electrical connections with all the other memory cells in their rows and columns. Each one of the memory cells comprises a field-effect transistor T1 having a floating gate and a control gate, which transistor is also referred to as floating gate transistor. Each one of the memory cells further comprises a select transistor T2 having a select gate, which select transistor T2 is placed in series with the floating gate transistor T1. Word lines WLi are each connected to the control gates of the floating gate transistors T1 situated in a common row i. Select lines SLi are each connected to the select gates of the select transistors T2 situated in a common row i. The word lines WLi and the select lines SLi are connected to means (not shown) for applying desired voltages to selected word lines WLi and select lines SLi. Bit lines BLj are each connected to the drains of the floating gate transistors Ti situated in a common column j and are connected to means (not shown) for applying desired voltages to selected bit lines BLj. Source lines ScL1 and ScL2, which are grounded in the present example, are each connected to the sources of the select transistors T2 situated in two adjacent common rows.

It will be clear that besides the memory cells, the non-volatile memory also comprises peripheral circuitry, which is not shown. Moreover, when embedded in a CMOS or BICMOS integrated circuit, the non-volatile memory may also be surrounded by logic device elements, which are also not shown.

Figure 2:
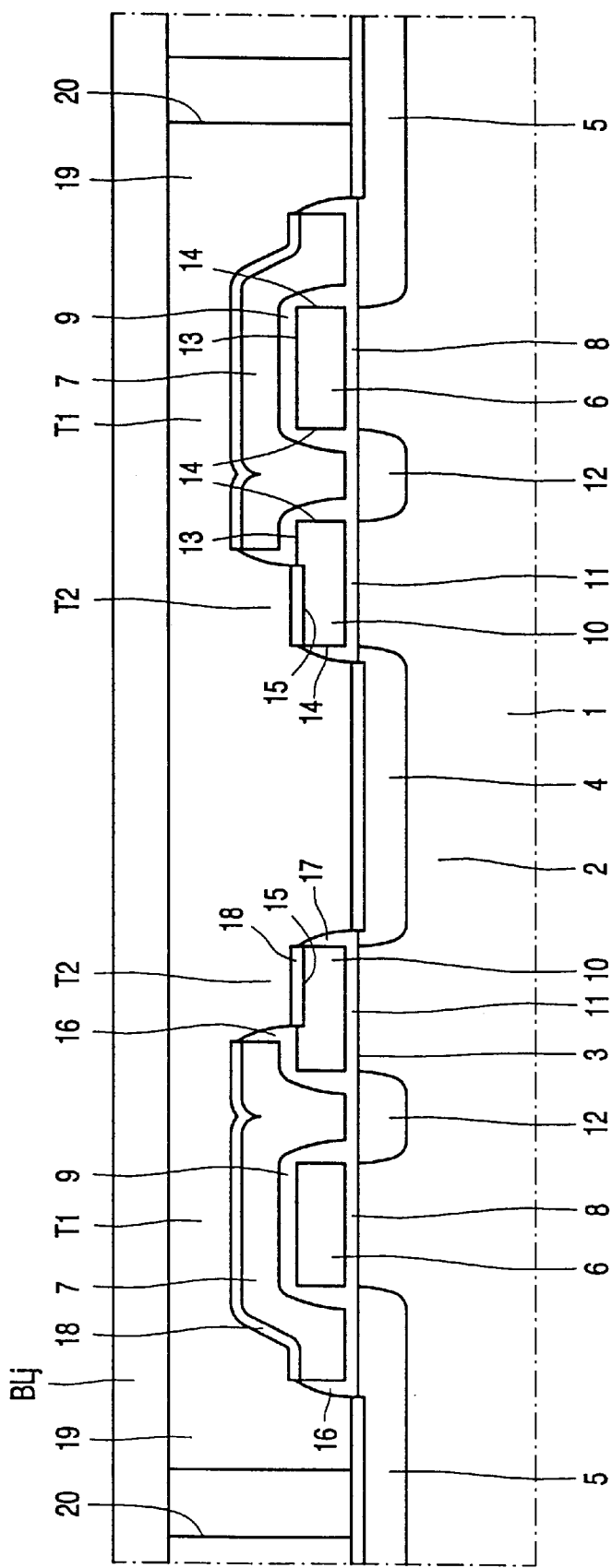
FIG. 2 is a diagrammatic cross-sectional view of adjacent memory cells situated in a common column of the non-volatile memory shown in FIG. 1.

FIG. 2 is a diagrammatic cross-sectional view of adjacent memory cells situated in a common column j of the non-volatile memory shown in FIG. 1. A semiconductor body 1, in the present example a monocrystalline silicon body, comprises a region 2 of a first conductivity type, in the present example p-type, adjoining a surface 3. The semiconductor body 1 is provided with memory cells at the surface 3, each one of the memory cells comprising a source 4 and a drain 5 of an opposite, second conductivity type, in the present example n-type. Between the source 4 and the drain 5 of each one of the memory cells, the surface 3 of the semiconductor body 1 is provided with a floating gate transistor T1 and a select transistor T2. The floating gate transistor T1 has a floating gate 6 composed of, for example, n-type polycrystalline silicon, above which floating gate 6 a control gate 7 is situated which is composed of, for example, n-type polycrystalline silicon as well. The floating gate 6 is insulated from the semiconductor body 1 by a floating gate dielectric 8 and from the control gate 7 by an inter-gate dielectric 9. Both the floating gate dielectric 8 and the inter-gate dielectric 9 may be composed of, for example, silicon oxide. The select transistor T2 has a select gate 10 which is insulated from the semiconductor body 1 by a gate dielectric 11. In the present example, a doped region 12 of the second conductivity type, in the present example n-type, is provided in an area of the semiconductor body 1 between the floating gate 6 and the select gate 10. The provision of such an additional doped region 12, however, is not necessary. Both the floating gate 6 and the select gate 10 have a substantially flat surface portion 13 extending substantially parallel to the surface 3 of the semiconductor body 1 and side-wall portions 14 extending substantially transversely to the surface 3 of the semiconductor body 1. In order to provide in a large capacitive coupling between the control gate 7 and the floating gate 6, the control gate 7 is capacitively coupled to the substantially flat surface portion 13 of the floating gate 6 and to at least the side-wall portions 14 of the floating gate 6 facing the source 4 and the drain 5. The control gate 7 which overlaps the select gate 10 of the selection transistor T2 ends above the substantially flat surface portion 13 of the select gate 10. It is advantageous that a substantial part 15 of the substantially flat surface portion 13 of the select gate 10 is left free, that is to say left uncovered by the control gate 7. The control gate 7 is provided with side-wall spacers 16 composed of, for example, silicon nitride or silicon oxide. The select gate 10 is also provided with a side-wall spacer 17 at the side of the source 4, which side-wall spacer 17 may also be composed of, for example, silicon oxide or silicon nitride. In order to reduce the sheet and contact resistances of the memory cells, exposed silicon regions are provided with a metal silicide 18; however, this is not necessary. Hence, the substantial part 15 of the substantially flat surface portion 13 of the select gate 10 which is not covered with the control gate 7 is provided with the metal silicide 18. Although another metal silicide such as, for example, cobalt silicide may be used, the metal silicide 18 advantageously comprises titanium silicide, more specifically the low-resistivity (C54) phase of titanium silicide. The memory cells are covered by a dielectric layer 19 composed of, for example, BPSG (boro-phospho-silicate glass) on top of TEOS (tetra-ethyl-ortho-silicate), which dielectric layer 19 is provided with a contact hole 20 to allow one of the bit lines BLj to contact the drain 5.

Examples of write, erase and read operations for the above-described non-volatile memory can be found in EP-A-763 856.

In the non-volatile memory described above, the select transistor T2 of each one of the memory cells is provided at the side of the floating gate adjacent to the source. Obviously, the select transistor may also be provided at the side of the floating gate adjacent to the drain. Alternatively, each one of the memory cells may comprise two select transistors instead of one, which select transistors are provided at either side of the floating gate. In that case the control gate of the floating gate transistor may end on the substantially flat surface portions of both select gates. Memory cells provided with two select transistors are often referred to as three-transistor (3T) cells.

The non-volatile memory can be readily manufactured by those skilled in the art using standard silicon technology processes. A description of a suitable manufacturing process is therefore omitted.

It will be apparent that the invention is not limited to the embodiments described above, but that many variations are possible to those skilled in the art within the scope of the invention. By way of example, the inter-gate dielectric may be composed of silicon oxynitride (SiON) or a sandwich of silicon oxide and silicon nitride (ONO) instead of silicon oxide.

What is claimed is:

1. A semiconductor device comprising a semiconductor body having a region of a first conductivity type adjoining a surface of the semiconductor body, which semiconductor body is provided at the surface with a non-volatile memory cell comprising a source and a drain of an opposite, second conductivity type provided in the semiconductor body, between which source and drain the surface of the semiconductor body is provided with a floating gate and a select gate, the floating gate and the select gate both having a substantially flat surface portion extending substantially parallel to the surface of the semiconductor body and having side-wall portions extending substantially transversely to the surface of the semiconductor body, above which floating gate a control gate is situated, which control gate overlaps the select gate, characterized in that the control gate is capacitively coupled to the substantially flat surface portion of the floating gate and to at least the side-wall portions of the floating gate facing the source and the drain, and ends above the substantially flat surface portion of the select gate wherein the floating gate does not extend over the select gate.

2. A semiconductor device as claimed in claim 1, characterized in that a substantial part of the substantially flat surface portion of the select gate is left free.

3. A semiconductor device as claimed in claim 1, characterized in that a metal silicide is provided on a part of the substantially flat surface portion of the select gate not covered by the control gate.

4. A semiconductor device as claimed in claim 3, characterized in that the metal silicide comprises titanium silicide.

5. A semiconductor device as claimed in claim 1, characterized in that a doped region of the second conductivity type is provided in a surface of the semiconductor body situated between the floating gate and the select gate.

6. A semiconductor device as claimed in claim 1, characterized in that the select gate is provided at the side of the floating gate adjacent to the source.

7. A semiconductor device as claimed in claim 1, characterized in that a further select gate is provided at the surface of the semiconductor body between the source and the drain, which further select gate is provided at the side of the floating gate lying opposite to the side provided with the former select gate.

8. A semiconductor device as claimed in claim 1, characterized in that the non-volatile memory cell is part of a matrix of memory cells, which matrix is embedded in a CMOS or BICMOS integrated circuit.

* * * * *